US012575091B2

(12) United States Patent
Li et al.

(10) Patent No.: US 12,575,091 B2
(45) Date of Patent: Mar. 10, 2026

(54) SEMICONDUCTOR STRUCTURE AND PROCESSOR

(71) Applicant: CHANGXIN MEMORY TECHNOLOGIES, INC., Hefei City (CN)

(72) Inventors: Minghao Li, Hefei (CN); Fengqin Zhang, Hefei (CN); Weibing Shang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 666 days.

(21) Appl. No.: 17/954,639

(22) Filed: Sep. 28, 2022

(65) Prior Publication Data

US 2023/0013413 A1     Jan. 19, 2023

Related U.S. Application Data

(63) Continuation of application No. PCT/CN2022/098101, filed on Jun. 10, 2022.

(30) Foreign Application Priority Data

Feb. 28, 2022    (CN) .......................... 202210189421.8

(51) Int. Cl.
| | |
|---|---|
| *H10B 12/00* | (2023.01) |
| *G11C 11/4096* | (2006.01) |
| *H01L 23/00* | (2006.01) |
| *H10D 10/01* | (2025.01) |
| *H10D 30/01* | (2025.01) |

(52) U.S. Cl.
CPC .......... *H10B 12/50* (2023.02); *G11C 11/4096* (2013.01); *H01L 24/01* (2013.01); *H10B 12/01* (2023.02); *H10B 12/09* (2023.02); *H10D 10/01* (2025.01); *H10D 30/01* (2025.01)

(58) Field of Classification Search
CPC ........................... H10B 12/50; G11C 11/4096
See application file for complete search history.

(56) References Cited

U.S. PATENT DOCUMENTS

| | | | |
|---|---|---|---|
| 6,317,374 | B2 | 11/2001 | Feurle |
| 6,636,453 | B2 | 10/2003 | Fischer |
| 7,203,102 | B2 | 4/2007 | Brox |

(Continued)

FOREIGN PATENT DOCUMENTS

| | | |
|---|---|---|
| CN | 105140147 A | 12/2015 |
| CN | 111446236 A | 7/2020 |
| CN | 114255802 A | 3/2022 |

*Primary Examiner* — Marlon T Fletcher
*Assistant Examiner* — Kimberly Newman Frey
(74) *Attorney, Agent, or Firm* — Syncoda LLC; Feng Ma

(57) ABSTRACT

A semiconductor structure and a memory are provided The semiconductor structure includes: a first active area pattern; a first gate pattern, a second gate pattern, a third gate pattern and a fourth gate pattern which are arranged at intervals in a first direction; a first connection pattern, arranged to connect the second gate pattern and the third gate pattern in parallel; a second connection pattern, arranged to connect the first gate pattern and the fourth gate pattern in parallel; at least two first contact hole patterns arranged in parallel; and at least two second contact hole patterns and at least two third contact hole patterns arranged in parallel.

14 Claims, 9 Drawing Sheets

(56)                           References Cited

U.S. PATENT DOCUMENTS

|  |  |  |  |
|---|---|---|---|
| 7,227,799 B2 | 6/2007 | Vogelsang | |
| 7,808,853 B2 | 10/2010 | Berthel | |
| 9,305,801 B2 * | 4/2016 | Sung | H01L 21/76816 |
| 10,163,491 B2 * | 12/2018 | Fujiwara | G11C 11/419 |
| 2001/0054719 A1 * | 12/2001 | Ahn | H10B 12/0335 |
|  |  |  | 257/E21.507 |
| 2002/0030236 A1 * | 3/2002 | Oyamatsu | H10B 10/12 |
|  |  |  | 257/E29.136 |
| 2011/0235407 A1 * | 9/2011 | Lim | H10B 10/12 |
|  |  |  | 257/E23.141 |
| 2021/0280140 A1 * | 9/2021 | Lee | H10D 86/441 |
| 2022/0208936 A1 * | 6/2022 | Kim | H10K 59/353 |

* cited by examiner

A

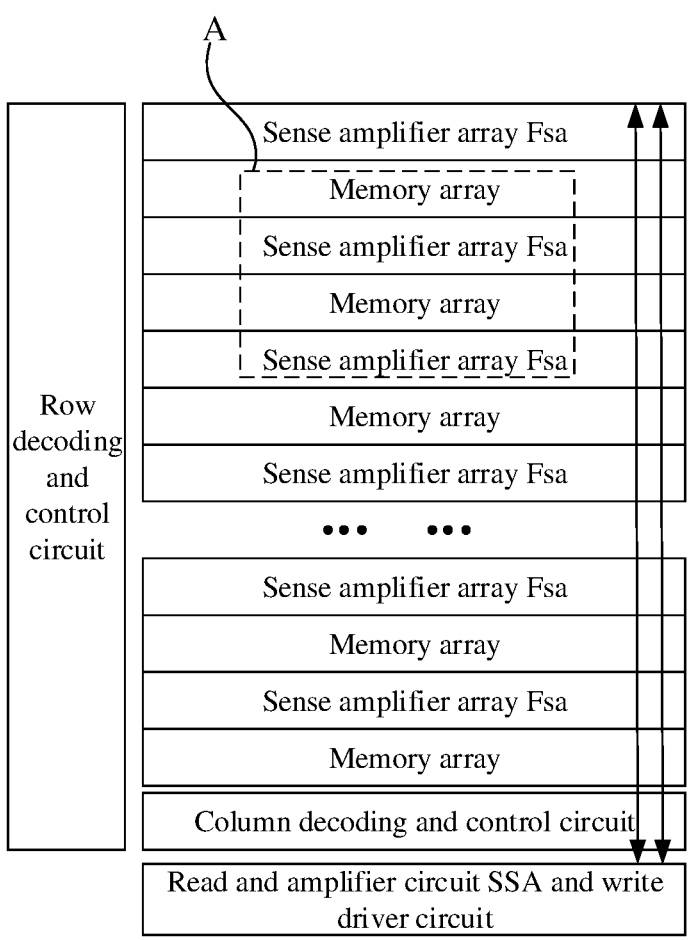

Sense amplifier array Fsa

Memory array

Sense amplifier array Fsa

Memory array

Sense amplifier array Fsa

Memory array

Sense amplifier array Fsa

• • •    • • •

Sense amplifier array Fsa

Memory array

Sense amplifier array Fsa

Memory array

Column decoding and control circuit

Row decoding and control circuit

Read and amplifier circuit SSA and write driver circuit

FIG. 1A

| Read circuit 100 | Local amplifier unit 110 | Write circuit 120 |

FIG. 1C

SEMICONDUCTOR STRUCTURE AND PROCESSOR

CROSS-REFERENCE TO RELATED APPLICATIONS

This application is a continuation of International Application No. PCT/CN2022/098101, filed on Jun. 10, 2022, which claims priority to Chinese Patent Application No. 202210189421.8, filed on Feb. 28, 2022. The disclosures of International Application No. PCT/CN2022/098101 and Chinese Patent Application No. 202210189421.8 are hereby incorporated by reference in their entireties.

BACKGROUND

With the increasing scale of the field of microprocessor designs, the memory area occupies most of the chip area, and with the development of technology, the proportion of the memory in the chip will be larger and larger. Therefore, designing a high-density memory can reduce the chip area to a certain extent, thus reducing the cost. With the increase of the memory density, the existing semiconductor structure has the problem of low reliability, and cannot meet the demand.

SUMMARY

The disclosure relates to the technical field of integrated circuits, and in particular, to a semiconductor structure and a processor.

In a first aspect, the present disclosure provides a semiconductor structure, which includes a first active area pattern; a first gate pattern, a second gate pattern, a third gate pattern, and a fourth gate pattern, the first gate pattern, the second gate pattern, the third gate pattern and the fourth gate pattern are arranged at intervals in a first direction, each of the first gate pattern, the second gate pattern, the third gate pattern and the fourth gate pattern extends in a second direction, and overlaps with the first active area pattern; a first connection pattern, arranged to connect the second gate pattern and the third gate pattern in parallel; a second connection pattern, arranged to connect the first gate pattern and the fourth gate pattern in parallel; at least two first contact hole patterns arranged in parallel, arranged on a side, away from the second gate pattern, of the first gate pattern, and each of the first contact hole patterns overlapping with the first active area pattern; at least two second contact hole patterns arranged in parallel, arranged between the second gate pattern and the third gate pattern, and each of the second contact hole patterns overlapping with the first active area pattern; and at least two third contact hole patterns arranged in parallel, arranged on a side, away from the third gate pattern, of the fourth gate pattern, and each of the third contact hole patterns overlaps with the first active area pattern.

In a second aspect, the present disclosure provides a processor, which includes the abovementioned semiconductor structure.

BRIEF DESCRIPTION OF THE DRAWINGS

FIG. 1A illustrates a schematic structural diagram of a dynamic random access memory.

FIG. 1C illustrates a schematic diagram of a read-write conversion circuit unit.

DETAILED DESCRIPTION

The following describes embodiments of the semiconductor structure and the processor according to the disclosure in detail with reference to accompanying drawings.

With reference to FIG. 1A, which illustrates a schematic structural diagram of a dynamic random access memory. The dynamic random access memory includes a memory array, sense amplifier arrays Fsa, a row decoding and control circuit XDEC, a column decoding and control circuit YDEC, a read and amplifier circuit SSA of signal on date line Gdat&Gdat # and a writer driver circuit of the signal on the date line Gdat&Gdat #.

Figure 1B:
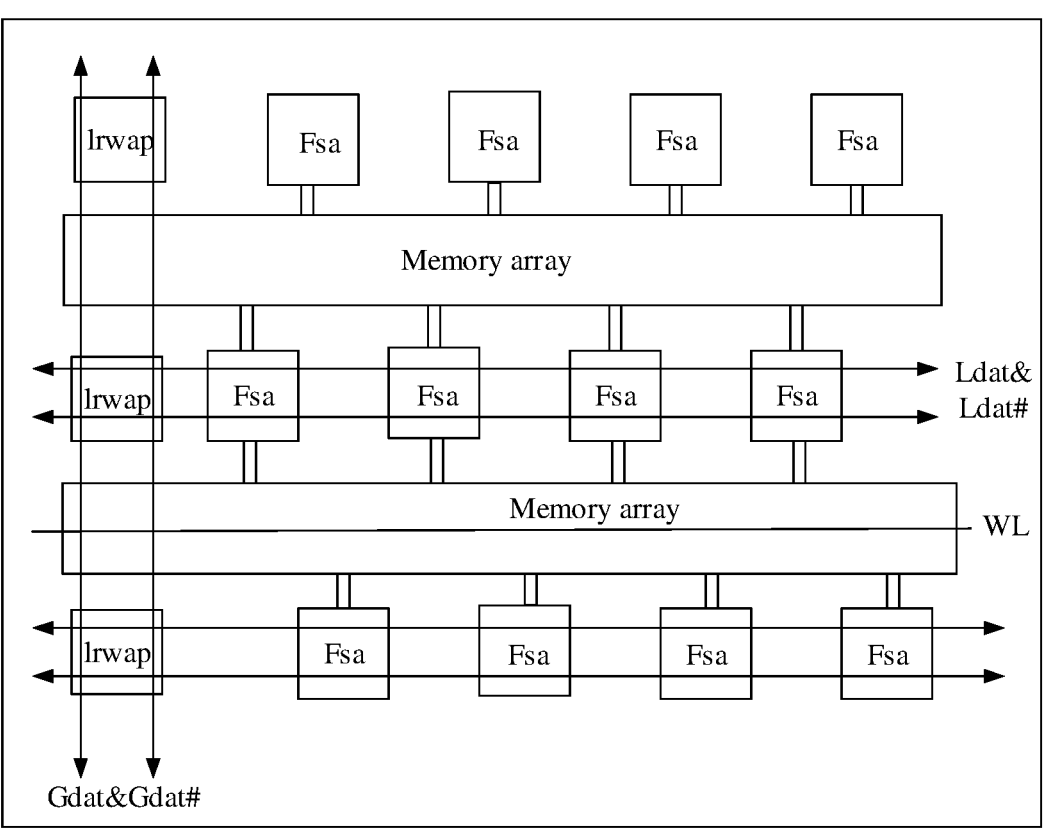
FIG. 1B illustrates an enlarged partial view of a portion shown by dashed box A in FIG. 1A.

FIG. 1B illustrates an enlarged partial view of a portion shown by dashed box A in FIG. 1A. After a Word Line (WL) is selected (after being controlled by XDEC decoding), data is transmitted to the sense amplifier arrays on an upper side and a lower side of the WL and then is written back to memory cells of the memory array connected to the selected WL. When the data needs to be changed or rewritten, the YDEC selects a corresponding sense amplifier array, the data is transmitted from a group of data line Gdat&Gdat # to a group of data line Ldat&Ldat # through a local read-write conversion circuit (lrwap), and then is written into the corresponding sense amplifier array and the memory cells of the connected memory array. When the data is read, the data transmission direction is opposite, the YDEC selects a corresponding sense amplifier array, the data is transmitted to the group of data line Ldat&Ldat #, then is transmitted to the group of data line Gdat&Gdat # through the local read-write conversion circuit (lrwap), and is finally amplified and output through the read and amplifier circuit SSA.

Figure 1C:
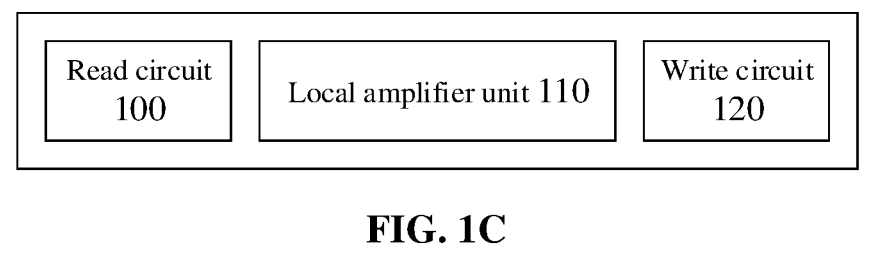

The read-write conversion circuit (lrwap) includes multiple read-write conversion circuit units. FIG. 1C illustrates a schematic diagram of a read-write conversion circuit unit. Each read-write conversion circuit unit includes a read circuit 100, a local amplifier unit 110, and a write circuit 120.

The embodiments of the disclosure provide a semiconductor structure for realizing related functions of the read-write conversion circuit unit. The semiconductor structure has high reliability.

Figure 2:
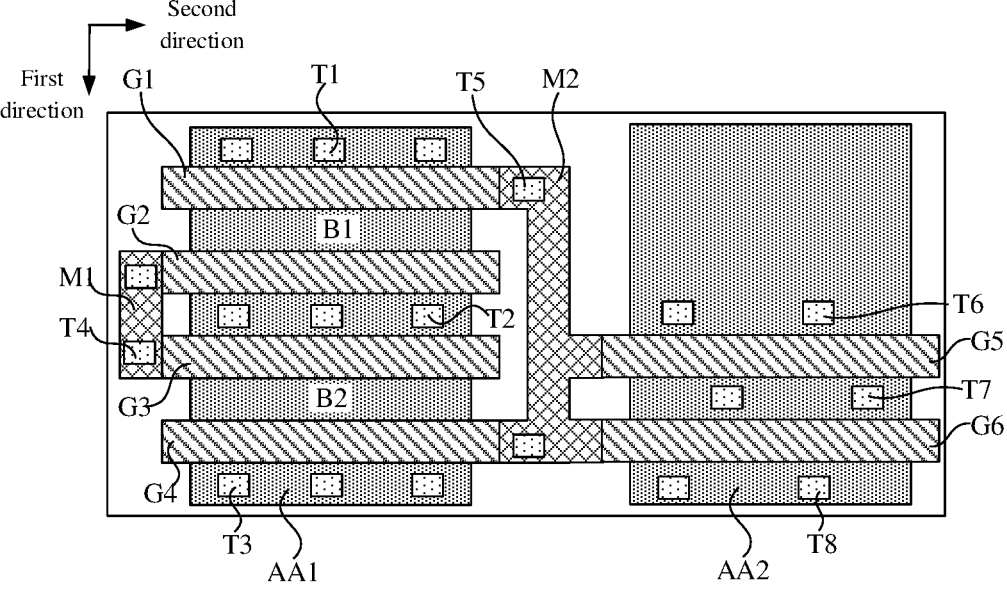
FIG. 2 illustrates a semiconductor structure according to a first embodiment of the disclosure.
Figure 3:
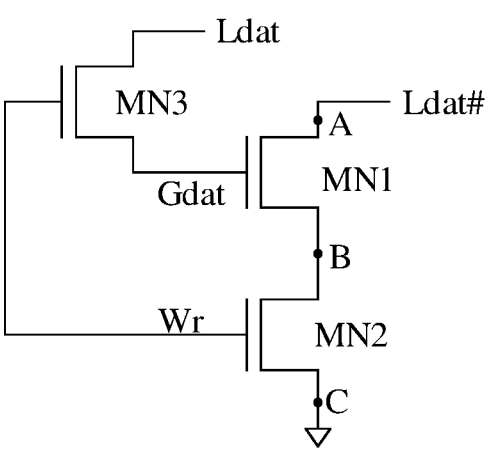
FIG. 3 illustrates a diagram of a write circuit of a semiconductor structure according to the first embodiment of the disclosure.

FIG. 2 illustrates a semiconductor structure according to a first embodiment of the disclosure. FIG. 3 illustrates a circuit diagram of a semiconductor structure according to the first embodiment of the disclosure, which is an example of a write circuit used for the signal on the data line Ldat/Ldat #.

With reference to FIG. 3, the circuit includes a first NMOS transistor MN1 and a second NMOS transistor MN2.

A first terminal of the first NMOS transistor MN1 is connected to the data line Ldat #. A second terminal of the first NMOS transistor MN1 is connected to a first terminal of the second NMOS transistor MN2. A control terminal of the first NMOS transistor MN1 is controlled by the signal on the data line Gdat. The second terminal of the second NMOS transistor MN2 is grounded. The control terminal of the second NMOS transistor MN2 is controlled by a write drive signal Wr.

The semiconductor structure forms a first NMOS transistor MN1 pattern and a second NMOS transistor MN2 pattern. With reference to FIG. 2, the semiconductor structure includes a first active area pattern AA1, a first gate pattern G1, a second gate pattern G2, a third gate pattern G3, a fourth gate pattern G4, a first connection pattern M1, a second connection pattern M2, first contact hole patterns T1, second contact hole patterns T2, and third contact hole patterns T3.

The first gate pattern G1, the second gate pattern G2, the third gate pattern G3, and the fourth gate pattern G4 are arranged at intervals in a first direction and each of the first gate pattern G1, the second gate pattern G2, the third gate pattern G3 and the fourth gate pattern G4 extends in a second direction. In the present embodiment, the first direction is perpendicular to the second direction. The first direction may be a direction parallel to a bit line of a semiconductor structure. The second direction may be a direction perpendicular to the bit line of the semiconductor structure, that is, the second direction may be a direction parallel to the word line of the semiconductor structure. Each of the first gate pattern G1, the second gate pattern G2, the third gate pattern G3, and the fourth gate pattern G4 overlaps with the first active area pattern AA1.

The second connection pattern M2 is arranged to connect the first gate pattern G1 and the fourth gate pattern G4 in parallel. The first gate pattern G1, the fourth gate pattern G4, and the first active area pattern AA1 form the first NMOS transistor MN1 pattern.

The first connection pattern M1 is arranged to connect the second gate pattern G2 and the third gate pattern G3 in parallel. The second gate pattern G2, the third gate pattern G3, and the first active area pattern AA1 form the second NMOS transistor MN2 pattern.

At least two first contact hole patterns T1 are arranged in parallel on a side, away from the second gate pattern G2, of the first gate pattern G1, and each of the first contact hole patterns T1 overlaps with the first active area pattern AA1. As an example, in the present embodiment, according to a length of the first gate pattern G1 and the first active area pattern AA1, the semiconductor structure includes three first contact hole patterns T1 arranged in parallel, which can not only avoid mutual influence of adjacent first contact hole patterns T1, but also provide as many first contact hole patterns T1 in parallel as possible.

At least two second contact hole patterns T2 are arranged in parallel between the second gate pattern G2 and the third gate pattern G3. Each of the second contact hole patterns T2 overlaps with the first active area pattern AA1. In the present embodiment, the semiconductor structure includes three second contact hole patterns T2 arranged in parallel.

At least two third contact hole patterns T3 are arranged in parallel on a side, away from the third gate pattern G3, of the fourth gate pattern G4, and each of the third contact hole patterns T3 overlaps with the first active area pattern AA1. In the present embodiment, the semiconductor structure includes three third contact hole patterns T3 arranged in parallel. The third contact hole patterns T3 correspond to a terminal A of the first NMOS transistor MN1 in FIG. 3.

In the present embodiment, the first gate pattern G1 and the second gate pattern G2 are connected in series, and the third gate pattern G3 and the fourth gate pattern G4 are connected in series. The first contact hole patterns T1 and the third contact hole patterns T3 correspond to terminal A in the first NMOS transistor MN1 in FIG. 3. The second contact hole patterns T2 correspond to terminal C of the second NMOS transistor MN2 in FIG. 3. The area between the first gate pattern G1 and the second gate pattern G2 and the area between the third gate pattern G3 and the fourth gate pattern G4 correspond to a common terminal B of the first NMOS transistor MN1 and the second NMOS transistor MN2. The layout areas corresponding to terminal B is not provided with a contact hole pattern, because the semiconductor structure according to the embodiments of the disclosure enables the potential of terminal B to be limited by terminal A and terminal C, thus having predictability. Therefore, the layout areas corresponding to terminal B do not need to be provided with a special contact hole pattern to limit the potential. Since terminal A corresponds to edge areas on opposite sides of the first active area, its potential is not predictable. Therefore, it is necessary to form contact holes to limit the potential, that is, it is necessary to form the first contact hole patterns T1 and the third contact hole patterns T3 on the edge areas on the opposites sides of the first active area AA1.

Since the contact hole patterns located on both sides of the same gate pattern are mutually limited, the limitation includes a spacing distance between the contact hole patterns in the second direction, and the spacing distance needs to be greater than a preset distance, so the first contact hole patterns T1 will be limited by the contact hole patterns in an area B1 (i.e., a layout area corresponding to terminal B) on the other side of the first gate pattern G1, the second contact hole patterns T2 will be limited by the contact hole patterns arranged in the area B1 (i.e., the layout area corresponding to terminal B) on the other side of the second gate pattern G2 and the contact hole patterns in an area B2 (i.e., a layout area corresponding to terminal B) on the other side of the third gate pattern G3, and the third contact hole patterns T3 will be limited by the contact hole patterns arranged in the area B2 (i.e., the layout area corresponding to terminal B) on the other side of the fourth gate pattern G4. In the semiconductor structure according to the embodiments of the disclosure, the area B1 and the area B2 (i.e., the layout areas corresponding to terminal B) are not provided with contact hole patterns, then the arrangement of the first contact hole patterns T1, the second contact hole patterns T2, and the third contact hole patterns T3 in the second direction is only limited by the preset distance, so that multiple first contact hole patterns T1, multiple second contact hole patterns T2, and multiple third contact hole patterns T3 can be arranged at preset distances within the length range of the first active area AA1.

With the increase of the integration level of the semiconductor structure, the process size is gradually reduced, and the contact holes become smaller and smaller, thus, more and more cases in which the performance of the semiconductor structure is degraded due to the defects of the contact holes, thereby affecting the performance and the yield of the semiconductor structures. In the embodiments of the disclosure, at least two first contact hole patterns T1 are arranged, and at least two first contact hole patterns T1 are arranged in parallel. When one of the first contact hole patterns T1 has a defect, the remaining first contact hole pattern T1 can still be used, which greatly improves the reliability of the semiconductor structure. Similarly, at least two second contact hole patterns T2 are arranged in parallel and at least two third contact hole patterns T3 are arranged in parallel, which greatly improves the reliability of the semiconductor structure.

In the present embodiment, multiple first contact hole patterns T1, multiple second contact hole patterns T2, and multiple third contact hole patterns T3 are all arranged at intervals in the second direction. In the present embodiment, in the first direction, the first contact hole patterns T1 are arranged in alignment with the second contact hole patterns T2 and the third contact hole patterns T3. In another embodiment, in the first direction, the first contact hole patterns T1 are staggered with the second contact hole patterns T2 and the third contact hole patterns T3. In the present embodiment, the number of the first contact hole patterns T1 is the same as that of the second contact hole patterns T2 and the third contact hole patterns T3. In other embodiments, the numbers of the first contact hole patterns T1, the second contact hole patterns T2, and the third contact hole patterns T3 may be partially the same or completely different.

In some embodiments, in the second direction, the first connection pattern M1 and the second connection pattern M2 are respectively arranged on opposite sides of the first active area AA1.

In some embodiments, the semiconductor structure further includes at least two fourth contact hole patterns T4 arranged in parallel. The at least two fourth contact hole patterns T4 overlap with the first connection pattern M1. In the present embodiment, the semiconductor structure includes two fourth contact hole patterns T4. The two fourth contact hole patterns T4 are respectively arranged at an end of the second gate pattern G2 and an end of the third gate pattern G3. The number of the fourth contact hole patterns T4 can be at least two, and the fourth contact hole patterns are arranged in parallel. When one of the fourth contact hole patterns T4 has a defect, the remaining fourth contact hole pattern T4 can still be used, which greatly improves the reliability of the semiconductor structure.

In some embodiments, the semiconductor structure further includes at least two fifth contact hole patterns T5 arranged in parallel. The at least two fifth contact hole patterns T5 overlap with the second connection pattern M2. In the present embodiment, when the semiconductor structure includes two fifth contact hole patterns, the two fifth contact hole patterns T5 are respectively arranged at an end of the first gate pattern G1 and an end of the fourth gate pattern G4. The number of the fifth contact hole patterns T5 can be at least two, and the fifth contact hole patterns are arranged in parallel. When one of the fifth contact hole patterns T5 has a defect, the remaining fifth contact hole pattern T5 can still be used, which greatly improves the reliability of the semiconductor structure.

Further with reference to FIG. 3, the circuit further includes a third NMOS transistor MN3. A first terminal of the third NMOS transistor MN3 is provided with Ldat signal (i.e., the signal on the data line Ldat), and a second terminal of the third NMOS transistor MN3 is connected to the control terminal of the first NMOS transistor MN1 to provide the Gdat signal (i.e., the signal on the data line Gdat). A control terminal of the third NMOS transistor MN3 is controlled by the write drive signal Wr.

Further with reference FIG. 2, in the present embodiment, the semiconductor structure further includes a second active area pattern AA2, a fifth gate pattern G5, and a sixth gate pattern G6.

The second active area pattern AA2 and the first active area pattern AA1 are arranged at an interval in the second direction, or arranged in parallel. The fifth gate pattern G5 and the sixth gate pattern G6 are arranged at an interval in the first direction and both extend in the second direction. The fifth gate pattern G5 and the sixth gate pattern G6 overlap with the second active area pattern AA2.

In an embodiment, in the second direction, the third gate pattern G3 and the fifth gate pattern G5 are arranged at an interval or arranged in parallel. The fourth gate pattern G4 and the sixth gate pattern G6 are arranged at an interval or arranged in parallel. Correspondingly, the fourth gate pattern G4 and the fifth gate pattern G5 are arranged in a staggered manner. The third gate pattern G3 and the sixth gate pattern G6 are arranged in a staggered manner. The fifth gate pattern G5 and the sixth gate pattern G6 are arranged in a staggered manner relative to the first gate pattern G1 and the second gate pattern G2.

The second connection pattern M2 is further arranged to connect the fifth gate pattern G5 and the sixth gate pattern G6 in parallel. The fifth gate pattern G5, the sixth gate pattern G6, and the second active area pattern AA2 form a third NMOS transistor MN3 pattern.

In some embodiments, the semiconductor structure further includes at least two sixth contact hole patterns T6 arranged in parallel, the at least two sixth contact hole patterns are arranged on a side, away from the sixth gate pattern G6, of the fifth gate pattern G5, and overlap with the second active area pattern AA2. The sixth contact hole patterns T6 are arranged at an interval in the second direction. For example, in the present embodiment, two sixth contact hole patterns T6 are illustrated exemplarily.

In some embodiments, the semiconductor structure further includes at least two seventh contact hole patterns T7 arranged in parallel. The seventh contact hole patterns T7 are arranged between the fifth gate pattern G5 and the sixth gate pattern G6, and overlap with the second active area pattern AA2. The seventh contact hole patterns T7 are arranged at an interval in the second direction. For example, in the present embodiment, two seventh contact hole patterns T7 are illustrated exemplarily.

In some embodiments, the semiconductor structure further includes at least two eighth contact hole patterns T8 arranged in parallel. The eighth contact hole patterns T8 are arranged on a side, away from the fifth gate pattern G5, of the sixth gate pattern G6, and overlap with the second active area pattern AA2. The eighth contact hole patterns T8 are arranged at an interval in the second direction. For example, in the present embodiment, two eighth contact hole patterns T8 are illustrated exemplarily.

In the present embodiment, in the second direction, the sixth contact hole patterns T6 and the seventh contact hole patterns T7 are arranged in a staggered manner at a set distance, and the seventh contact hole patterns T7 and the eighth contact hole patterns T8 are arranged in a staggered manner at a set distance. The set distance needs to meet the followings requirements: any contact hole pattern is not affected by other contact hole patterns, and the parasitic capacitance and the parasitic inductance between adjacent contact hole patterns is less than a preset value.

The semiconductor structure according to the first embodiment of the disclosure can implement the write circuit for the signal on the data line Ldat/Ldat # as illustrated in FIG. 3.

Figure 4:
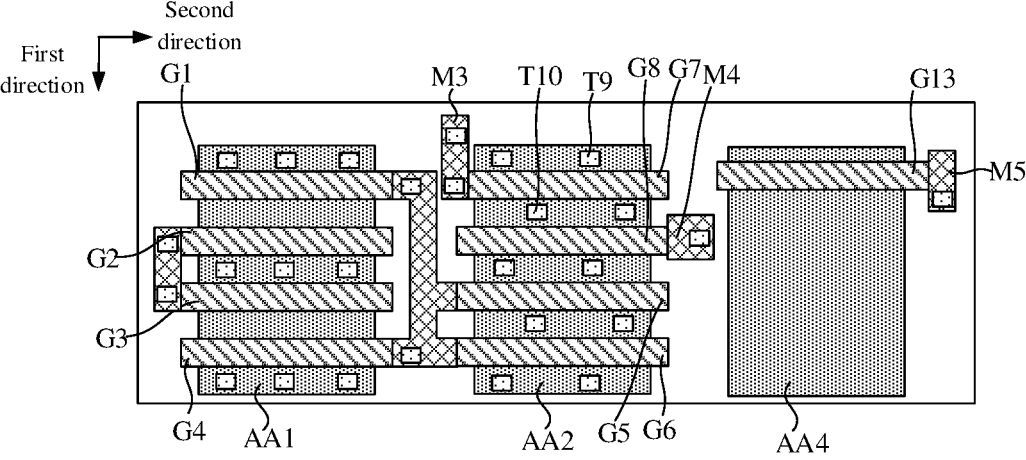
FIG. 4 illustrates the semiconductor structure according to a second embodiment of the disclosure.
Figure 5:
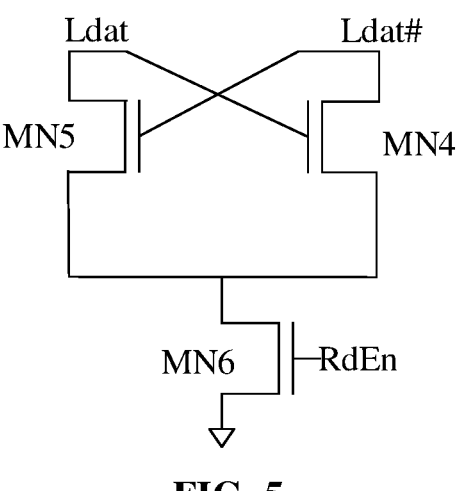
FIG. 5 illustrates a circuit diagram of a semiconductor structure according to the second embodiment of the disclosure.

On the basis of the semiconductor structure as illustrated in the first embodiment, a second embodiment of the disclosure further provides a semiconductor structure. FIG. 4 illustrates the semiconductor structure according to the second embodiment of the disclosure. FIG. 5 illustrates a circuit of a semiconductor structure according to the second embodiment of the disclosure, which is an example of part of a circuit of a local amplifier for the signal on the data line Ldat/Ldat #.

With reference to FIG. 5, in the present embodiment, the circuit includes a fourth NMOS transistor MN4, a fifth NMOS transistor MN5, and a sixth NMOS transistor MN6. A first terminal of the fourth NMOS transistor MN4 is connected to the data line Ldat #. A second terminal of the fourth NMOS transistor MN4 is connected to a first terminal of the sixth NMOS transistor MN6. A control terminal of the fourth NMOS transistor MN4 is controlled by the signal on the data line Ldat. A first terminal of the fifth NMOS transistor MN5 is connected to the data line Ldat. A second terminal of the fifth NMOS transistor MN5 is connected to the first terminal of the sixth NMOS transistor MN6. A control terminal of the fifth NMOS transistor MN5 is controlled by the signal on the data line Ldat #. A second terminal of the sixth NMOS transistor MN6 is grounded. A control terminal of the sixth NMOS transistor MN6 is controlled by a read enable signal RdEn.

In the second embodiment, the semiconductor structure includes a seventh gate pattern G7, an eighth gate pattern G8, a third connection pattern M3, and a fourth connection pattern M4. The seventh gate pattern G7 and the eighth gate pattern G8 are arranged at an interval in the first direction and each of the seventh gate pattern and the eighth gate pattern extends in the second direction. The seventh gate pattern G7 and the eighth gate pattern G8 overlap with the second active area pattern AA2. In the second direction, the first gate pattern G1 and the seventh gate pattern G7 are arranged at an interval, and the second gate pattern G2 and the eighth gate pattern G8 are arranged at an interval. In the first direction, the seventh gate pattern G7, the eighth gate pattern G8, the fifth gate pattern G5, and the sixth gate pattern G6 are arranged at intervals. The third connection pattern M3 is connected to the seventh gate pattern G7. The seventh gate pattern G7 and the second active area pattern AA2 form a fourth NMOS transistor MN4 pattern. The fourth connection pattern M4 is connected to the eighth gate pattern G8. The eighth gate pattern G8 and the second active area pattern AA2 form a fifth NMOS transistor MN5 pattern.

In some embodiments, at least two ninth contact hole patterns T9 arranged in parallel are arranged on a side, away from the eighth gate pattern G8, of the seventh gate pattern G7, and overlap with the second active area pattern AA2. In the present embodiment, the semiconductor structure includes two ninth contact hole patterns T9 arranged in parallel, and the two ninth contact hole patterns T9 are arranged at an interval in the second direction.

In some embodiments, at least two tenth contact hole patterns T10 arranged in parallel are arranged between the seventh gate pattern G7 and the eighth gate pattern G8, and overlap with the second active area pattern AA2. In the present embodiment, the semiconductor structure includes two tenth contact hole patterns T10 arranged in parallel. The two tenth contact hole patterns T10 are arranged at an interval in the second direction. In the first direction, the ninth contact hole patterns T9 and the tenth contact hole patterns T10 are arranged in a staggered manner.

In the present embodiment, the semiconductor structure further includes a fourth active area pattern AA4 and a thirteenth gate pattern G13. The fourth active area pattern AA4 and the second active area pattern AA2 are arranged at an interval in the second direction. The thirteenth gate pattern G13 extends in the second direction, and overlaps with the fourth active area pattern AA4. The fifth connection pattern M5 is connected to the thirteenth gate pattern G13. The thirteenth gate pattern G13 and the fourth active area pattern AA4 form a sixth NMOS transistor MN6 pattern. The fifth connection pattern M5 is configured to receive a read enable signal RdEn.

In the second embodiment, the semiconductor structure is capable of forming a write circuit for the signal on the data line Ldat/Ldat # as illustrated in FIG. 3, and part of the circuit of the local amplifier for the signal on the data line Ldat/Ldat # as illustrated in FIG. 5.

Figure 6:
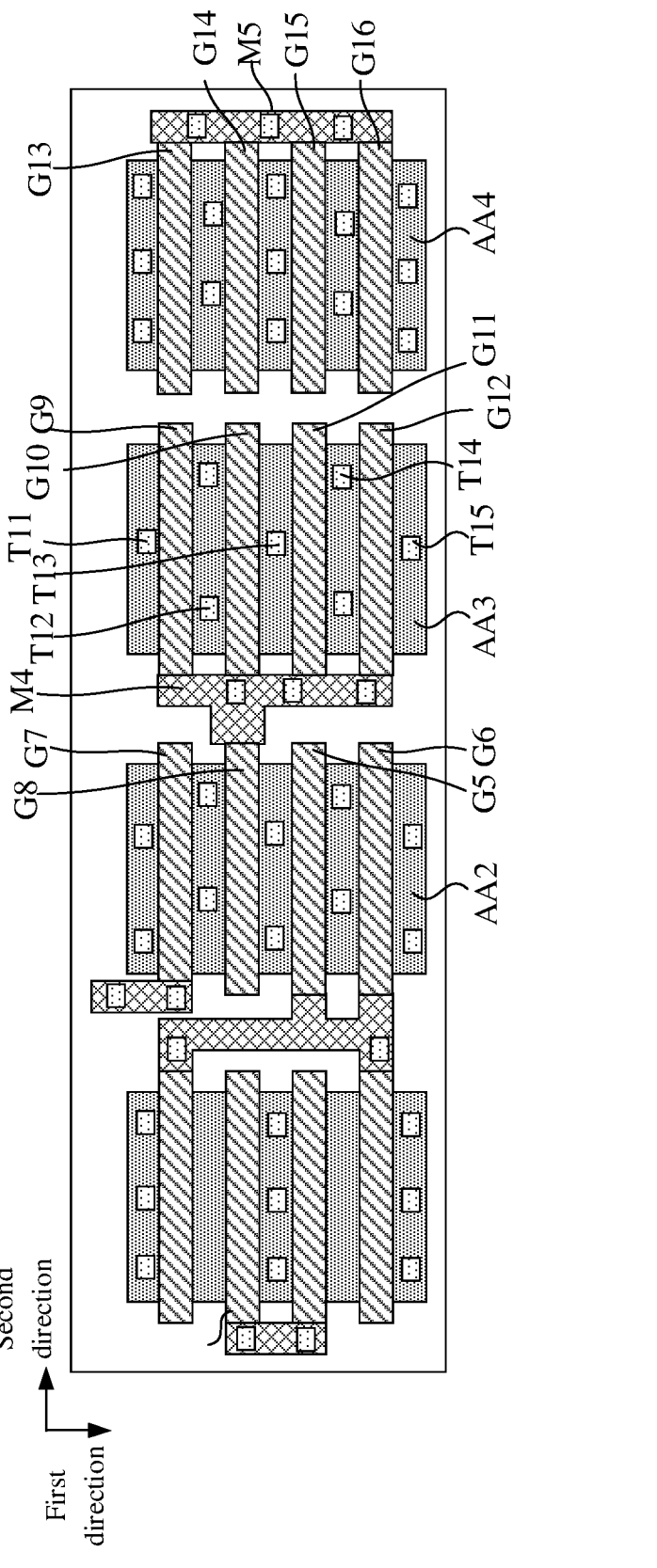
FIG. 6 illustrates a semiconductor structure according to a third embodiment of the disclosure.
Figure 7:
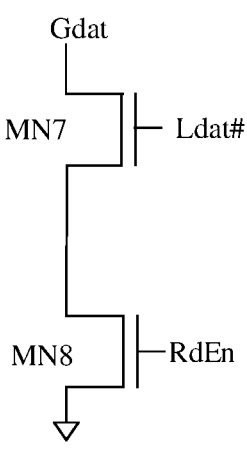
FIG. 7 illustrates a diagram of a read circuit of a semiconductor structure according to the third embodiment of the disclosure.

On the basis of the semiconductor structure as illustrated in the second embodiment, a third embodiment of the disclosure further provides a semiconductor structure. FIG. 6 illustrates the semiconductor structure according to the third embodiment of the disclosure. FIG. 7 illustrates a circuit diagram of a semiconductor structure according to the third embodiment of the disclosure, which is an example of a circuit for converting the Ldat/Ldat # signal (i.e., the signal on the data line Ldat/Ldat #) to Gdat/Gdat # signal (i.e., the signal on the data line Gdat/Gdat #) when reading the Ldat/Ldat # signal.

Referring to FIG. 7, in the present embodiment, the circuit includes a seventh NMOS transistor MN7 and an eighth NMOS transistor MN8. A first terminal of the seventh NMOS transistor MN7 is connected to the data line Gdat. A second terminal of the seventh NMOS transistor MN7 is connected to a first terminal of the eighth NMOS transistor MN8. A control terminal of the seventh NMOS transistor MN7 is controlled by the signal on the data line Ldat #. A second terminal of the eighth NMOS transistor MN8 is grounded. The control terminal of the eighth NMOS transistor MN8 is controlled by a read enable signal RdEn.

In the third embodiment, the semiconductor structure includes a third active area pattern AA3, a ninth gate pattern G9, a tenth gate pattern G10, an eleventh gate pattern G11, and a twelfth gate pattern G12.

In the second direction, the third active area pattern AA3 and the second active area pattern AA2 are arranged at an interval. In the present embodiment, the third active area pattern AA3 is arranged between the second active area pattern AA2 and the fourth active area pattern AA4. The ninth gate pattern G9, the tenth gate pattern G10, the eleventh gate pattern G11, and the twelfth gate pattern G12 are arranged at intervals in the first direction and all extend in the second direction. The ninth gate pattern G9, the tenth gate pattern G10, the eleventh gate pattern G11, and the twelfth gate pattern G12 overlap with the third active area pattern AA3.

In an embodiment, in the second direction, the seventh gate pattern G7, the ninth gate pattern G9, and the thirteenth gate pattern G13 are arranged at intervals. The eighth gate pattern G8 and the tenth gate pattern G10 are arranged at an interval, the fifth gate pattern G5 and the eleventh gate pattern G11 are arranged at an interval, and the sixth gate pattern G6 and the twelfth gate pattern G12 are arranged at intervals.

The fourth connection pattern M4 is further configured to connect the ninth gate pattern G9, the tenth gate pattern G10, the eleventh gate pattern G11, and the twelfth gate pattern G12 in parallel. The ninth gate pattern G9, the tenth gate pattern G10, the eleventh gate pattern G11, the twelfth gate pattern G12 and the third active area pattern AA3 form a seventh NMOS transistor pattern MN7.

In some embodiments, the semiconductor structure further includes an eleventh contact hole pattern T11, twelfth contact hole patterns T12, a thirteenth contact hole pattern T13, fourteenth contact hole patterns T14, and a fifteenth contact hole pattern T15.

At least one eleventh contact hole pattern T11 is arranged on a side, away from the tenth gate pattern G10, of the ninth gate pattern G9, and overlaps with the third active area pattern AA3. In the present embodiment, an eleventh contact hole pattern T11 is illustrated exemplarily.

At least two twelfth contact hole patterns T12 arranged in parallel are arranged between the ninth gate pattern G9 and the tenth gate pattern G10, and overlap with the third active area pattern AA3. In the present embodiment, two twelfth contact hole patterns T12 are illustrated exemplarily.

The eleventh contact hole pattern T11 and the twelfth contact hole patterns T12 are respectively arranged on both sides of the ninth gate pattern G9, and the arrangements of the eleventh contact hole pattern and the twelfth contact hole patterns are mutually limiting. Since the eleventh contact hole pattern T11 serves to limit the potential, and the number of the eleventh contact hole pattern only needs to meet the requirements. Therefore, in the present embodiment, reducing the number of the eleventh contact hole patterns T11 enables the number of the twelfth contact hole patterns T12 to be increased accordingly. The twelfth contact hole patterns T12, which are arranged to connect a source terminal of the transistor is greater in number than the eleventh contact hole patterns T11, allowing the source terminal to have more contact holes arranged in parallel to meet the requirements for current transmission at the source terminal.

At least one thirteenth contact hole pattern T13 is arranged between the tenth gate pattern G10 and the eleventh gate pattern G11, and overlaps with the third active area pattern AA3. In the present embodiment, one thirteenth contact hole pattern T13 is illustrated exemplarily.

At least two fourteenth contact hole patterns T14 arranged in parallel are arranged between the eleventh gate pattern G11 and the twelfth gate pattern G12, and overlap with the third active area pattern AA3. In the present embodiment, two fourteenth contact hole patterns T14 are illustrated exemplarily.

At least one fifteenth contact hole pattern T15 is arranged on a side, away from the eleventh gate pattern G11, of the twelfth gate pattern G12, and overlaps with the third active area pattern AA3. In the present embodiment, one fifteenth contact hole pattern T15 is illustrated exemplarily.

Since the fourteenth contact hole patterns T14 and the fifteenth contact hole pattern T15 are respectively arranged on both sides of the twelfth gate pattern G12, the arrangements of the fourteenth contact hole patterns and the fifteenth contact hole pattern are mutually limiting. Since the fifteenth contact hole pattern T15 serves to limit the potential, and the number of the fifteenth contact hole pattern only needs to meet the requirements. Therefore, in the present embodiment, reducing the number of the fifteenth contact hole pattern T15 enables the number of the fourteenth contact hole patterns T14 to be increased accordingly. The fourteenth contact hole patterns T14 are arranged to connect a source terminal of a transistor. The number of the fourteenth contact hole patterns T14 is greater than the number of the fifteenth contact hole pattern T15, allowing the source terminal to have more contact holes arranged in parallel to meet the requirement for current transmission at the source terminal.

In the present embodiment, the semiconductor structure further includes a fourteenth gate pattern G14, a fifteenth gate pattern G15, and a sixteenth gate pattern G16. The fourteenth gate pattern G14, the fifteenth gate pattern G15, and the sixteenth gate pattern G16 are arranged at an interval in the first direction and all extend in the second direction. The fourteenth gate pattern G14, the fifteenth gate pattern G15, and the sixteenth gate pattern G16 overlap with the fourth active area pattern AA4. In the present embodiment, in the second direction, the tenth gate pattern G10 and the fourteenth gate pattern G14 are arranged at an interval, the eleventh gate pattern G11 and the fifteenth gate pattern G15 are arranged at an interval, and the twelfth gate pattern G12 and the sixteenth gate pattern G16 are arranged at an interval.

The fifth connection pattern M5 is further connected to the fourteenth gate pattern G14, the fifteenth gate pattern G15, and the sixteenth gate pattern G16. The fourteenth gate pattern G14, the fifteenth gate pattern G15, the sixteenth gate pattern G16, and the fourth active area pattern AA4 form an eighth NMOS transistor MN8.

The semiconductor structure according to the third embodiment of the disclosure enables to form the write circuit for the signal on the data line Ldat/Ldat # as illustrated in FIG. 3, part of the circuit of the local amplifier for the signal on the data line Ldat/Ldat # as illustrated in FIG. 5, and the circuit for converting the signal on the data line Ldat/Ldat # to the signal on the data line Gdat/Gdat # when reading the signal on the data line Ldat/Ldat # as illustrated in FIG. 7.

Another aspect of the embodiment of the disclosure further provides a processor. The processor includes the abovementioned semiconductor structure. The semiconductor structure may be provided with multiple contact holes in parallel. When one of the contact holes has a defect, the remaining contact hole can also be still used, which greatly improves the reliability of the semiconductor structure.

The forgoing are preferred implementation modes of the disclosure. It should be noted that a number of modifications and refinements can also be made by those of ordinary skill in the art without departing from the principles of the disclosure, and such modifications and refinements are also considered to be within the scope of protection of the disclosure.

What is claimed is:

1. A semiconductor structure, comprising:
   a first active area pattern;
   a first gate pattern, a second gate pattern, a third gate pattern, and a fourth gate pattern which are arranged at intervals in a first direction, each of the first gate pattern, the second gate pattern, the third gate pattern, and the fourth gate pattern extending in a second direction, and overlapping with the first active area pattern;
   a first connection pattern, arranged to connect the second gate pattern and the third gate pattern in parallel;
   a second connection pattern, arranged to connect the first gate pattern and the fourth gate pattern in parallel;
   at least two first contact hole patterns arranged in parallel, arranged on a side, away from the second gate pattern, of the first gate pattern, and each of the first contact hole patterns overlapping with the first active area pattern;
   at least two second contact hole patterns arranged in parallel, arranged between the second gate pattern and the third gate pattern, and each of the second contact hole patterns overlapping with the first active area pattern;

at least two third contact hole patterns arranged in parallel, arranged on a side, away from the third gate pattern, of the fourth gate pattern, and each of the third contact hole patterns overlapping with the first active area pattern;

at least two fourth contact hole patterns arranged in parallel, wherein the at least two fourth contact hole patterns overlap with the first connection pattern; wherein one of the at least two fourth contact hole patterns is arranged at the overlap regions between the first connection pattern and the second gate pattern to connect the first connection pattern to the second gate pattern, and the other of the at least two fourth contact hole patterns is arranged at the overlap regions between the first connection pattern and the third gate pattern to connect the first connection pattern to the third gate pattern; and at least two fifth contact hole patterns arranged in parallel, wherein the at least two fifth contact hole patterns overlap with the second connection pattern; wherein one of the at least two fifth contact hole patterns is arranged at the overlap regions between the second connection pattern and the first gate pattern to connect the second connection pattern to the first gate pattern, and the other of the at least two fifth contact hole patterns is arranged at the overlap regions between the second connection pattern and the fourth gate pattern to connect the second connection pattern to the fourth gate pattern.

2. The semiconductor structure of claim 1, wherein the first contact hole patterns, the second contact hole patterns, and the third contact hole patterns are all arranged at intervals in the second direction.

3. The semiconductor structure of claim 1, wherein in the second direction, the first connection pattern and the second connection pattern are arranged on both sides of the first active area pattern, respectively.

4. The semiconductor structure of claim 1, further comprising:

a second active area pattern, arranged at an interval with the first active area pattern in the second direction; and a fifth gate pattern and a sixth gate pattern which are arranged at an interval in the first direction, each of the fifth gate pattern and the sixth gate pattern extending in the second direction, and overlapping with the second active area pattern, wherein the second connection pattern is further arranged to connect the fifth gate pattern and the sixth gate pattern in parallel.

5. The semiconductor structure of claim 4, wherein in the second direction, the third gate pattern and the fifth gate pattern are arranged at an interval, and the fourth gate pattern and the sixth gate pattern are arranged at an interval.

6. The semiconductor structure of claim 5, further comprising:

at least two sixth contact hole patterns arranged in parallel, arranged on a side, away from the sixth gate pattern, of the fifth gate pattern, and overlapping with the second active area pattern;

at least two seventh contact hole patterns arranged in parallel, arranged between the fifth gate pattern and the sixth gate pattern, and overlapping with the second active area pattern; and at least two eighth contact hole patterns arranged in parallel, arranged on a side, away from the fifth gate pattern, of the sixth gate pattern, and overlapping with the second active area pattern.

7. The semiconductor structure of claim 6, wherein the sixth contact hole patterns are arranged at an interval in the second direction, the seventh contact hole patterns are arranged at an interval in the second direction, and the eighth contact hole patterns are arranged at an interval in the second direction; and wherein in the second direction, the sixth contact hole patterns and the seventh contact hole patterns are arranged in a staggered manner at a set distance, and the seventh contact hole patterns and the eighth contact hole patterns are arranged in a staggered manner at a set distance.

8. The semiconductor structure of claim 4, further comprising:

a seventh gate pattern and an eighth gate pattern which are arranged at an interval in the first direction, each of the seventh gate pattern and the eighth gate pattern extending in the second direction, and overlapping with the second active area pattern, and in the second direction, the first gate pattern and the seventh gate pattern being arranged at an interval, and the second gate pattern and the eighth gate pattern being arranged at an interval;

a third connection pattern, connected to the seventh gate pattern; and a fourth connection pattern, connected to the eighth gate pattern.

9. The semiconductor structure of claim 8, further comprising:

at least two ninth contact hole patterns arranged in parallel, arranged on a side, away from the eighth gate pattern, of the seventh gate pattern, and overlapping with the second active area pattern; and at least two tenth contact hole patterns arranged in parallel, arranged between the seventh gate pattern and the eighth gate pattern, and overlapping with the second active area pattern.

10. The semiconductor structure of claim 8, further comprising:

a third active area pattern, arranged at an interval with the second active area pattern in the second direction;

a ninth gate pattern, a tenth gate pattern, an eleventh gate pattern, and a twelfth gate pattern which are arranged at intervals in the first direction, each of the ninth gate pattern, the tenth gate pattern, the eleventh gate pattern, and the twelfth gate pattern extending in the second direction, and overlapping with the third active area pattern, wherein the fourth connection pattern is further arranged to connect the ninth gate pattern, the tenth gate pattern, the eleventh gate pattern, and the twelfth gate pattern in parallel.

11. The semiconductor structure of claim 10, further comprising:

at least one eleventh contact hole pattern, arranged on a side, away from the tenth gate pattern, of the ninth gate pattern, and overlapping with the third active area pattern;

at least two twelfth contact hole patterns arranged in parallel, arranged between the ninth gate pattern and the tenth gate pattern, and overlapping with the third active area pattern;

at least one thirteenth contact hole pattern, arranged between the tenth gate pattern and the eleventh gate pattern, and overlapping with the third active area pattern;

at least two fourteenth contact hole patterns arranged in parallel, arranged between the eleventh gate pattern and the twelfth gate pattern, and overlapping with the third active area pattern; and at least one fifteenth contact hole pattern, arranged on a side, away from the eleventh gate pattern, of the twelfth gate pattern, and overlapping with the third active area pattern.

12. The semiconductor structure of claim 11, wherein a number of the twelfth contact hole patterns is greater than a number of the eleventh contact hole patterns.

13. The semiconductor structure of claim 11, wherein a number of the fourteenth contact hole patterns is greater than a number of the fifteenth contact hole patterns.

14. A memory, comprising the semiconductor structure of claim 1.

* * * * *